United States Patent
Dominguez (10) Patent No.: US 10,715,079 B2
(45) Date of Patent: Jul. 14, 2020

(54) PROCESS FOR MANUFACTURING A PHOTOVOLTAIC CONCENTRATOR COMPRISING AN OPTICAL STRUCTURE EQUIPPED WITH TWO OPTICAL-LENS STAGES

(71) Applicant: COMMISSARIAT A L'ENERGIE ATOMIQUE ET AUX ENERGIES ALTERNATIVES, Paris (FR)

(72) Inventor: Cesar Dominguez, Bourgoin-Jallieu (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 204 days.

(21) Appl. No.: 15/529,650

(22) PCT Filed: Nov. 25, 2015

(86) PCT No.: PCT/EP2015/077631
§ 371 (c)(1),
(2) Date: May 25, 2017

(87) PCT Pub. No.: WO2016/083446
PCT Pub. Date: Jun. 2, 2016

(65) Prior Publication Data
US 2017/0324369 A1 Nov. 9, 2017

(30) Foreign Application Priority Data
Nov. 26, 2014 (FR) ...................................... 14 61500

(51) Int. Cl.
*B29D 11/00* (2006.01)
*H02S 40/22* (2014.01)
(Continued)

(52) U.S. Cl.
CPC .......... *H02S 40/22* (2014.12); *H01L 31/0543* (2014.12); *H01L 31/18* (2013.01);
(Continued)

(58) Field of Classification Search
CPC ........................ B29D 11/0048; B29D 11/0049
See application file for complete search history.

(56) References Cited

U.S. PATENT DOCUMENTS 6,804,062 B2 10/2004 Atwater et al.
2001/0028506 A1* 10/2001 Fujimoto ................. B41J 2/451
359/622
(Continued)

FOREIGN PATENT DOCUMENTS

EP 2 139 046 A1 12/2009

OTHER PUBLICATIONS

Jared et al., "Micro-concentrators for a microsystems-enabled photovoltaic system", Optics Express, vol. 22, No. S2, Mar. 10, 2014, pp. 1-7; in English; cited in the Specification.
(Continued)

*Primary Examiner* — Lisa L Herring
(74) *Attorney, Agent, or Firm* — Seckel IP, PLLC (57) ABSTRACT

The process for manufacturing a photovoltaic concentrator comprising a photovoltaic substrate (2) equipped with a plurality of photovoltaic cells (5), and an optical structure (1) comprising a first optical-lens stage (4) and a second optical-lens stage (3) that are intended to optically interact with each other, includes (i) providing a mould (6); and (ii) simultaneously forming the first optical-lens stage (4) and the second optical-lens stage (3) using said provided mould (6), and implementing a step of filling said mould (6) with a material (100), especially by injecting or pouring said material (100).

12 Claims, 3 Drawing Sheets

(51) Int. Cl.
*H01L 31/18* (2006.01)
*H01L 31/054* (2014.01)

(52) U.S. Cl.
CPC .... *B29D 11/0048* (2013.01); *B29D 11/00298* (2013.01); *Y02E 10/52* (2013.01)

(56) References Cited

U.S. PATENT DOCUMENTS

| | | |
|---|---|---|
| 2012/0273025 A1 | 11/2012 | Tomlinson et al. |
| 2013/0104984 A1* | 5/2013 | Myrskog ........... H01L 31/02327 136/259 |
| 2014/0063610 A1* | 3/2014 | Murata ............ B29D 11/00326 359/613 |
| 2014/0261625 A1 | 9/2014 | Morgan et al. |
| 2014/0261683 A1 | 9/2014 | Morgan et al. |
| 2015/0068584 A1* | 3/2015 | Sweatt ............... G02B 19/0042 136/246 |

OTHER PUBLICATIONS

International Search Report and Written Opinion dated Jan. 25, 2016 issued in corresponding application No. PCT/EP2015/077631; w/ English partial translation and partial machine translation (20 pages).

* cited by examiner

PROCESS FOR MANUFACTURING A PHOTOVOLTAIC CONCENTRATOR COMPRISING AN OPTICAL STRUCTURE EQUIPPED WITH TWO OPTICAL-LENS STAGES

TECHNICAL FIELD OF THE INVENTION

The invention relates to the field of photovoltaic concentrators.

The subject of the invention is more particularly a process for manufacturing a photovoltaic concentrator.

Yet another subject of the invention relates to a mould in particular intended to be used in the manufacturing process.

PRIOR ART

It is known that the concentration of solar energy onto a photovoltaic cell allows its efficiency to be improved and the amount of expensive semiconductors used to be decreased, by replacing them with less expensive optical materials. Thus, the literature teaches many solutions implementing lens-based systems for concentrating light rays towards an active area of a photovoltaic cell.

Document U.S. Pat. No. 6,804,062 especially teaches the use of two lenses formed independently from each other from suitable moulds.

The document "Micro-concentrators for a microsystems-enabled photovoltaic system" by Bradley H. Jared et al. published in OPTICS EXPRESS A521 Vol. 22, No. S2 dated 10 Mar. 2014 especially describes the use of an optical concentrator comprising two stages of lenses made of polycarbonate. Manufacture of this optical concentrator requires the use of two separate moulds having reference marks allowing guiding elements to be moulded with a view to alignment after demoulding of the two lens stages.

The manufacture of such an optical concentrator requires separate moulding steps, and may cause problems as regards the alignment of the optical stages obtained from these separate moulds.

SUBJECT OF THE INVENTION

The aim of the present invention is to provide a solution that remedies all or some of the drawbacks listed above.

This aim is achieved in part by virtue of a process for manufacturing a photovoltaic concentrator comprising a photovoltaic substrate equipped with a plurality of photovoltaic cells, and an optical structure comprising a first optical-lens stage and a second optical-lens stage that are intended to optically interact with each other, said process including the following steps:
  providing a mould; and
  simultaneously forming the first optical-lens stage and the second optical-lens stage using said provided mould, and implementing a step of filling said mould with a material, especially by injecting or pouring said material.

In particular, the step of providing said mould is such that said provided mould includes a first face equipped with a plurality of first cavities each delimiting a shape complementary to that of a corresponding optical lens of the first optical-lens stage and a second face equipped with a plurality of second cavities each delimiting a shape complementary to that of a corresponding optical lens of the second optical-lens stage.

Advantageously, the process includes the following steps implemented before the filling step:
  adding the photovoltaic substrate to or placing the photovoltaic substrate on the second face of the mould such that each photovoltaic cell is placed in a corresponding second cavity; and
  adding a transparent wall to or placing a transparent wall on the first face of the mould.

Especially, the filling step includes a step of guiding the material such that the material fills each of the first cavities and each of the second cavities.

For example, the guiding step includes using a network of flow channels formed in the second face of the mould to channel a flow of said material in order to fill each of the second cavities.

According to one embodiment, the photovoltaic cells being electrically connected to one another by electrical connection elements formed on the surface of the photovoltaic substrate bearing the photovoltaic cells, the guiding step allows the network of channels to be filled with the material and, as a result, the electrical connection elements to be encapsulated by said material after curing of said material.

The process may include a step of removing said mould, comprising disengaging the formed first optical-lens stage relative to the formed second optical-lens stage, the step of removing said mould being followed by a step of assembling the first optical-lens stage and the second optical-lens stage.

Advantageously, the process includes a step of positioning of the photovoltaic substrate relative to the transparent wall, carried out before curing of the material, in order to allow, after demoulding of said mould, the assembling step to be implemented with an alignment, corresponding to said positioning, of the second optical-lens stage fixed to the photovoltaic substrate relative to the first optical-lens stage fixed to said transparent wall.

According to one embodiment, the material used in the filling step is a transparent polymer that is able to be shaped by casting or injection moulding, and especially a polymer that is curable after casting or injection moulding.

If the filling step is carried out by pouring the material into the mould, said material is a PDMS. Alternatively, if the filling step is carried out by injecting the material into the mould, said material is a PC or PMMA.

The invention also relates to a mould for manufacturing an optical structure for the photovoltaic concentrator, said optical structure comprising a first optical-lens stage and a second optical-lens stage that are intended to optically interact with each other, said mould including a first face equipped with a plurality of first cavities each delimiting a shape complementary to that of a corresponding optical lens of the first optical-lens stage and a second face equipped with a plurality of second cavities each delimiting a shape complementary to that of a corresponding optical lens of the second optical-lens stage.

The mould may include a network of channels formed in the second face and intended to allow said second cavities to be filled, said network of channels being configured so that filling it leads to encapsulation of electrical connection elements electrically connecting photovoltaic cells of a photovoltaic substrate of the photovoltaic concentrator.

The invention also relates to an optical concentrator comprising an optical structure comprising a first optical-lens stage and a second optical-lens stage that are intended to optically interact with each other, the optical structure being of integral construction or a single object.

The invention also relates to a photovoltaic concentrator comprising a photovoltaic substrate equipped with a plurality of photovoltaic cells, and an optical structure comprising a first optical-lens stage and a second optical-lens stage that are intended to optically interact with each other, the optical structure being of integral construction or a single object.

The invention lastly relates to a photovoltaic concentrator obtained by implementing the manufacturing process defined above.

BRIEF DESCRIPTION OF THE DRAWINGS

Other advantages and features will become more clearly apparent from the following description of particular embodiments of the invention, which are given by way of nonlimiting example and shown in the appended drawings, in which.

DESCRIPTION OF PREFERRED
EMBODIMENTS OF THE INVENTION

The process for manufacturing a photovoltaic concentrator comprising an optical structure described below differs from the prior art especially in that the two optical-lens stages are obtained from the same mould, and especially simultaneously.

By "the two optical-lens stages are obtained simultaneously", what is meant is that they are formed in the same step of filling said mould, especially by injection or pouring, with a material suitable for moulding the optical-lens stages. As a result, these two optical-lens stages may be obtained in a single filling step, thereby making it possible to rationalize manufacture of the optical structure (fewer steps, avoidance of the need to manage different mould references, etc.).

In the present description, a photovoltaic concentrator includes an optical structure, also called an optical concentrator, and a photovoltaic substrate equipped with photovoltaic cells.

An optical concentrator comprising two optical-lens stages allows the concentration ratio between the largest of the lenses (also called the primary lens and required to collect the light so as to concentrate it in the direction of the secondary lens) and a corresponding photovoltaic cell of a substrate to be increased, while increasing the angular tolerance of the photovoltaic substrate relative to the normal to the sun. Relative to a photovoltaic concentrator comprising a single lens stage, the use of two stages makes it possible to more easily tend towards the maximum theoretical light concentration, this maximum concentration being given by the theorem of conservation of etendue.

Figure 1:
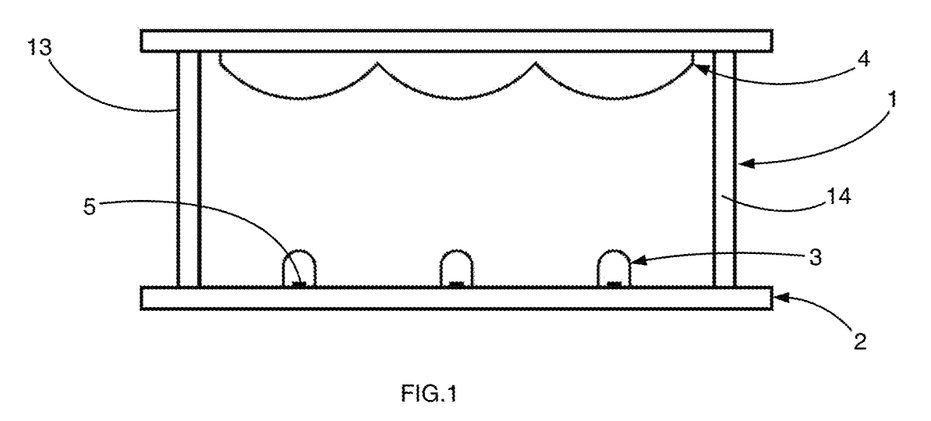
FIG. 1 is a side view of a photovoltaic concentrator formed according to one embodiment of the invention.

FIG. 1 illustrates a photovoltaic concentrator comprising an optical structure 1 and a photovoltaic substrate 2 equipped with a plurality of photovoltaic cells 5. The optical structure 1 comprises a first optical-lens stage 4 (also called the primary stage in the field) and a second optical-lens stage 3 (also called the secondary stage in the field) that are intended to optically interact with each other.

The optical interaction between the first and second optical-lens stages 4, 3 may be such that a beam/light ray entering with a normal incidence into a lens of the first optical-lens stage 4 is deviated so as to converge on a corresponding lens of the second optical lens stage 3. More particularly, the light is said to be normal to the photovoltaic concentrator within an angle of plus or minus one degree (typically in the context of concentration of higher than 100 times) with the aim of reaching a photovoltaic cell 5.

In particular, the second optical-lens stage 3 is intended to be fixed to the photovoltaic substrate 2, especially during the moulding of the second optical-lens stage 3. Each lens of the second optical lens-stage 3 especially forms a lens resting on one (especially only one) photovoltaic cell 5 of the photovoltaic substrate 2. It will thus be understood that each optical lens of the first optical-lens stage 4 is thus configured so as to make the corresponding light radiation of normal incidence converge in the direction of a lens of the second optical-lens stage 3 that itself makes the light radiation received converge towards the photovoltaic cell 5 on which it rests. Generally, in order to allow the desired optical concentration to be obtained, the optical lenses of the first optical-lens stage 4 have a larger area than the area of the optical lenses of the second optical-lens stage 3.

In particular, the photovoltaic substrate 2 may include at least one rigid carrier, especially one based on polymethyl methacrylate (PMMA) or glass or even analogous to a printed circuit board in the case of a microconcentrator. The carrier is intended to bear the photovoltaic cells 5, and electrical connection elements (not shown) electrically connecting the photovoltaic cells 5 to one another, especially in series to decrease the total current, and therefore losses due to series resistance (ohmic losses). The photovoltaic substrate 2 may have undergone a treatment in order to promote the adhesion of a material that will be used to mould the second lens stage 3 (plasma or corona treatment), this treatment is especially used when the material forming the printed circuit board is PMMA or glass, and in the context where the optical lenses of the second optical-lens stage 3 will be moulded directly on the photovoltaic substrate 2 in order to encapsulate each corresponding photovoltaic cell 5. Especially, each lens of the second optical-lens stage 3 encapsulates a corresponding photovoltaic cell.

Figure 2:
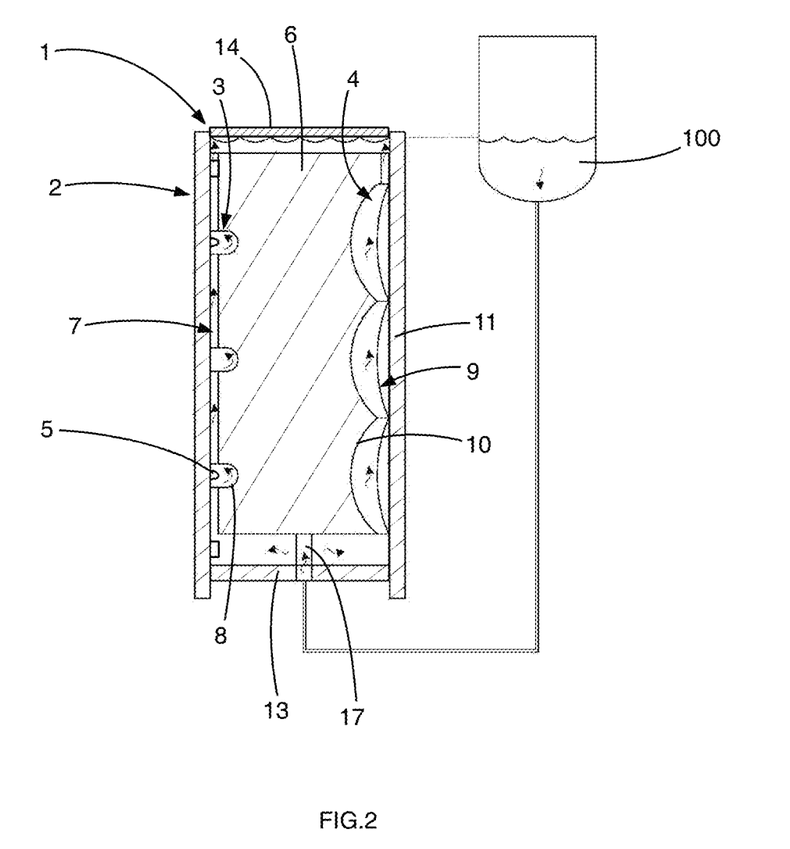
FIG. 2 is a cross-sectional view of the mould used to simultaneously form the two lens stages of the optical structure of the concentrator.
Figure 3:
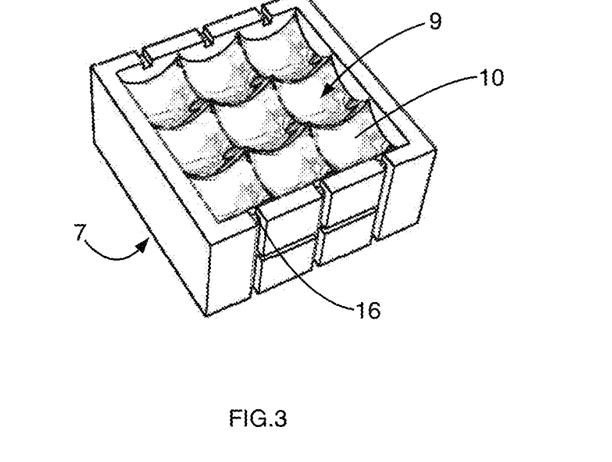
FIG. 3 illustrates a perspective view of one particular embodiment of a mould used in the manufacturing process according to the invention.

As illustrated in FIG. 2, the process for manufacturing the photovoltaic concentrator such as described includes a step of providing a mould 6 and a step of simultaneously forming the second optical-lens stage 3 and the first optical-lens stage 4 using said provided mould 6 and implementing a step of filling said provided mould 6 with a material 100. In particular, the simultaneous formation implements a single step of filling said provided mould 6 with a material 100. Especially, the filling step is carried out by injecting or pouring said material 100.

In fact, the material 100 used in the filling step may be a transparent polymer able to be shaped by casting or by injection moulding. Especially, this polymer may be curable after casting or injection moulding. With the injection moulding technique a pressure is applied to the material 100, which is not the case for the casting technique. In the case where the filling step is carried out by pouring the material into the provided mould 6 (casting technique), then the material 100 is a PDMS (polydimethylsiloxane). In the case where the filling step is carried out by injecting the material 100 into said provided mould 6 (injection moulding technique) then the material is a PC (polycarbonate) or PMMA (polymethyl methacrylate).

Each of the lenses of the second optical-lens stage 3 may be the shape of a dome the convex portion of which is oriented towards the first optical-lens stage 4. The lenses of the second optical-lens stage 3 may have an aspherical circular aperture (i.e. the shape is free while possessing symmetry about an axis of rotation). According to one variant, the lenses of the second lens stage may be of the CPC (compound parabolic concentrator) or DTIR (dielectric total internal reflection) type enabling geometric concentrations closer to the theoretical maxima, but in this case the material used to form said lenses will have to have a sufficient elasticity to permit adequate demoulding without damage to said lenses (in this case a PDMS type material may be poured into the mould 6).

Each of the optical lenses of the first optical-lens stage 4 may be the shape of an aspherical planar-convex concentrating lens having a square aperture, the convex portion of which is oriented towards the second optical-lens stage 3. The f-number of the aperture of each lens of the first optical-lens stage 4 is close to 1 (i.e. between 1 and 2). Because the lenses of the first lens stage 4 have very small aperture areas, the volume of a lens of the first lens stage 4 is very small even if it is not truncated to form Fresnel facets, which introduce optical losses and make demoulding of the mould more difficult.

As a result, the mould 6 includes negative imprints (or cavities) allowing these optical lenses of the first and second stages to be produced. Preferably, to facilitate the demoulding, the cavities intended to form the optical lenses are prepared with a draft, i.e. they are sunk perpendicularly and not with a re-entrant angle. In other words, in order to make it easier to extract the first and second optical-lens stages 4, 3 from the mould 6, or in order to prevent material being stripped off during extraction of the first and second optical-lens stages 4, 3, no face of the first and second optical-lens stages 4, 3 formed by the set and especially poured or injected material may be strictly perpendicular to the parting line of the mould (in other words, no face may be strictly parallel to the opening direction of the mould). Thus, to make demoulding possible, no face may have a negative draft. If the material used has a sufficient elasticity after it has been set (especially PDMS poured into the mould), re-entrant cavities will possibly also be used.

According to one embodiment, the provided mould 6 is such that it allows the first optical-lens stage 4 and the second optical-lens stage 3 to be moulded in such a way that the position of the first optical-lens stage 4 in the mould 6 relative to the second optical-lens stage 3 in the mould 6 corresponds to the position desired for the first optical-lens stage 4 relative to the second optical-lens stage 3 in an assembly configuration of the photovoltaic concentrator. According to an alternative, the moulding is such that it is enough just to modify the separation of the first and second optical-lens stages to obtain the assembly configuration. The use of such a mould 6 especially enables subsequent participation in a suitable alignment between the first optical-lens stage 4 and the second optical-lens stage 3, by taking into account this alignment from the manufacturing stage.

The assembly configuration described above corresponds to that in which the photovoltaic concentrator is supposed to operate when it is oriented towards sunlight so as to concentrate it on the photovoltaic cells 5 of the photovoltaic substrate 2.

It will be understood from the above that the filling step is such that the especially injected or poured material 100 fills the cavities of said mould 6. All or some of these cavities are the shapes desired for said optical lenses of the first optical-lens stage 4 and of the second optical-lens stage 3.

Figure 4:
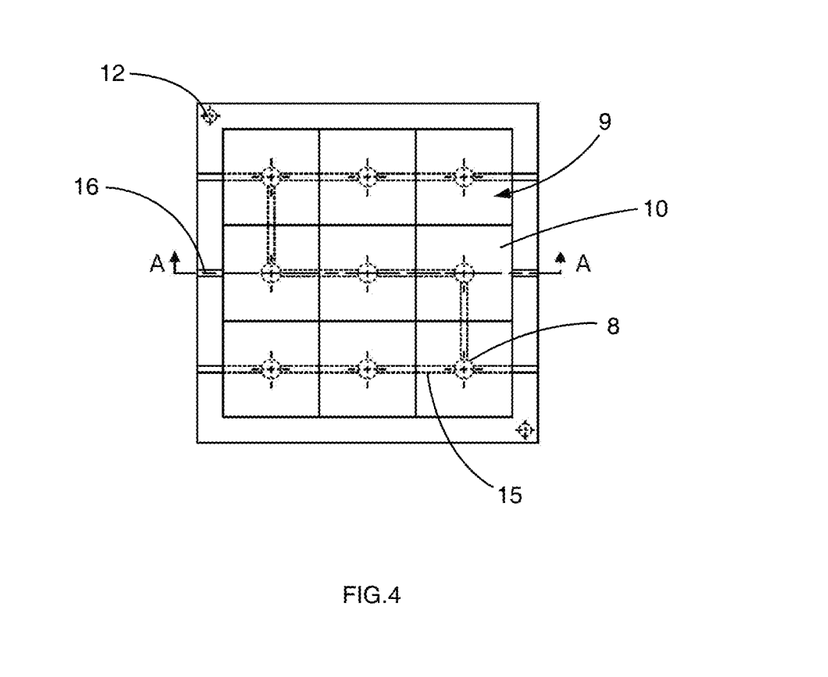
FIG. 4 is a top view of the mould in FIG. 3, oriented towards a face intended for moulding the first lens stage.
Figure 5:
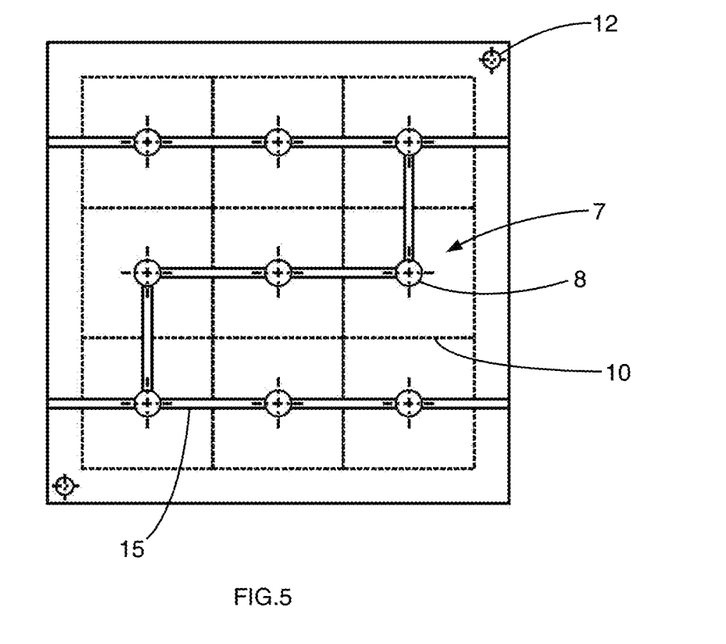
FIG. 5 is a bottom view of the mould in FIG. 3, oriented towards a face intended for moulding the second lens stage.
Figure 6:
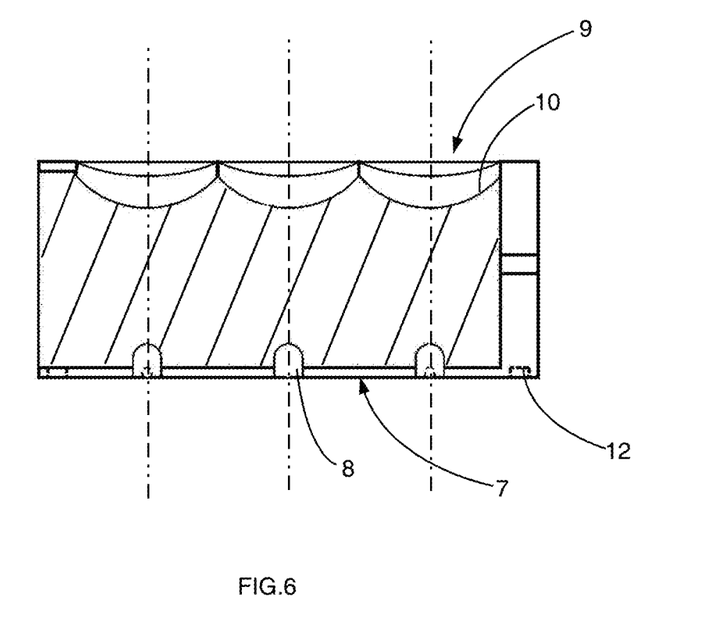
FIG. 6 is a cross-sectional view along A-A in FIG. 4.

FIGS. 2 to 6 illustrate one particular embodiment of said provided mould 6. In particular, the step of providing said mould 6 is such that said provided mould 6 includes a first face 9 equipped with a plurality of first cavities 10 (also called primary cavities in the field). Each cavity of the plurality of first cavities 10 delimits a shape complementary to that of a corresponding optical lens of the first optical-lens stage 4. Said mould 6 furthermore includes a second face 7 equipped with a plurality of second cavities 8 (also called secondary cavities in the field). Each cavity 8 of the second plurality of optical cavities delimits a shape complementary to that of a corresponding optical lens of the second optical-lens stage 3. In FIGS. 4 and 5, the dotted lines show non-visible elements of the hidden faces 7, 9. These first and second faces 9, 7 are opposite, especially such as to mould the first and second optical-lens stages in a position corresponding to that of the assembled optical concentrator and therefore ready to be used.

According to one implementation illustrated in FIG. 2, the process for manufacturing the photovoltaic concentrator includes the following steps implemented before the step of filling the provided mould 6 with the material 100: adding the photovoltaic substrate 2 to the second face 7 of the mould 6 such that each photovoltaic cell 5 of the photovoltaic substrate 2 is placed in a corresponding second cavity 8 (especially, after addition of the photovoltaic substrate 2, each second cavity 8 includes a single photovoltaic cell 5 in particular placed at the focal point of the future lens of the second optical-lens stage 3, which lens is formed by filling said second cavity 8); and adding a transparent wall 11 to the first face 9 of the mould 6.

In the present description, the transparent wall 11 is considered to be transparent to the light radiation that it is sought to concentrate on the photovoltaic cells 5, especially it is transparent to radiation the wavelength of which is comprised between 300 nanometres and 1800 nanometres, i.e. the spectral range to which multi-junction photovoltaic cells based on crystalline germanium are sensitive. As a result, the lenses of the first lens stage and the second lens stage are also preferably transparent, in particular to said light radiation, especially in the aforementioned wavelength range.

The added photovoltaic substrate 2 and the added transparent wall 11 close the mould 6 so as to delimit the volume of each second and first cavity 8, 10 to be filled, especially by injection or pouring, with the material 100.

Especially, the material 100, once in the mould 6, especially once having been poured or injected into the mould, and set, fixes the photovoltaic substrate 2 to the second optical-lens stage 3 and fixes the transparent wall 11 to the first optical-lens stage 4. In other words, after the mould 6 has been demoulded, and as a result of the step of filling the mould 6 with the material 100 and of curing the material 100, which is especially injected or poured, the second optical-lens stage 3 is fixed to said photovoltaic substrate 2 and the first optical-lens stage 4 is fixed to said transparent wall 11. Thus, the moulding according to the invention makes it possible to produce optical lenses directly on their carriers, contrary to the prior art that required, after demoulding, additional steps of addition to carriers.

After the photovoltaic substrate 2 and the transparent wall 11 have been added, the process may include a step of locking the photovoltaic substrate 2 and the transparent wall 11 relative to the mould 6 in order to prevent their relative movement during the step of filling the mould with the material 100 and during the curing of the material 100, which is especially poured or injected. Specifically, any movement would lead to a misalignment of the two optical stages.

Preferably, the mould 6 includes positioning elements 12 (shown in FIGS. 4 to 6) configured so as to interact with positioning elements of the photovoltaic substrate 2 in order to ensure that each photovoltaic cell 5 is positioned in one of the corresponding second cavities 8, and that, after moulding of the associated lens of the second optical-lens stage 3, said cell is positioned at the focal point of said lens. According to one nonlimiting example, the positioning elements 12 of the mould 6 are holes and the positioning elements of the photovoltaic substrate 2 are pins configured so as to penetrate the holes of the mould 6. In other words, the step of adding the photovoltaic substrate 2 to the second face 7 may include a step of positioning the photovoltaic substrate 2 relative to the mould 6 to obtain the suitable position described above.

Furthermore, in order to make it easier to assemble the optical concentrator after demoulding of the mould 6, the process may include, before the step of forming the two optical-lens stages 3, 4, adding or fitting spacers 13, 14 (FIG. 2) making contact with the transparent wall 11 and the photovoltaic substrate 2 in order to ensure the spacing of the latter is adapted to that after assembly of the optical concentrator consecutively to the removal from the mould 6 and/or a positioning between the transparent wall 11 and the photovoltaic substrate 2. As a result these spacers 13, 14 will possibly be used after demoulding of the first and second optical-lens stages 4, 3 to ensure a suitable separating distance between said first and second optical-lens stages 4, 3 during an assembly step of the optical concentrator, as shown in FIG. 1. Especially, adhesive (for example a silicone elastomer adhesive) may be used to fix the spacers 13, 14 to the photovoltaic substrate 2 and to the transparent wall 11 after demoulding.

Advantageously, the step of filling the mould 6 with the material 100 is especially such that said step fills the cavities described above and intended to form the lenses of the first and second optical stages 4, 3. As a result, the formation of the second optical-lens stage 3 concomitantly produces an encapsulation of said photovoltaic cells 5, thus protecting them from dust and moisture when the set, and especially injected or poured, material 100 fixes the second optical-lens stage 3 to the photovoltaic substrate 2.

According to one improvement, the step of filling the mould 6 with the material 100 includes a step of guiding the material 100, which is especially injected or poured, such that the material 100, which is especially injected or poured, fills each of the first cavities 10 and each of the second cavities 8. Especially, the guiding step includes using a network of flow channels 15 (FIGS. 4 and 5) formed in the second face 7 of the mould 6 to channel a flow of said material 100, which is especially injected or poured, in order to fill each of the second cavities 8 and/or at least one channel 16 formed in the first face 9 of the mould 6 (FIGS. 3 and 4) and connecting one of the first cavities 10. The network of channels 15 especially allows the second cavities 8 to be connected to one another, so as to fill them when the photovoltaic substrate 2 is added to the mould 6. Regarding the first cavities 10, they are preferably in direct communication and thus the guiding from one cavity 10 to another cavity 10 occurs naturally, especially by way of a communicating vessel effect, when the transparent wall 11 is added to the mould 6.

Advantageously to promote the demoulding, the channels of the mould 6 are prepared with a draft.

According to one example, when the photovoltaic substrate 2 and the transparent wall 11 have been added to the mould 6, the material 100 may be injected or poured into a corresponding chamber 17 (FIG. 2) distributing the material via the use of the channels 15, 16 described above, which are then in communication with said chamber 17. According to this particular example, the chamber 17 may be placed on one side of the mould 6, and be at least partially delimited by the aforementioned spacer 13, the transparent wall 11 and the photovoltaic substrate 2.

According to one aforementioned embodiment, the photovoltaic cells 5 may be electrically connected to one another by electrical connection elements (especially tracks which may for example be made of copper) that are formed on the surface of the photovoltaic substrate 2 bearing said photovoltaic cells 5. This being the case, the mould 6 may include channels linking the second cavities 8 (it may then be a question of the network of channels 15 described above) such that the material 100, which is especially injected or poured, fills said channels and the second cavities 8. As a result, after curing of the material 100 fixed to the photovoltaic substrate 2, the latter encapsulates both the electrical connection elements and the photovoltaic cells. In other words, the step of guiding the material 100, which is especially injected or poured, may allow the network of channels 15 to be filled with the material 100 and, as a result, the electrical connection elements (and especially the cavities 8) to be encapsulated by said material 100 after curing of said material 100 (thus ensuring protection from dust and moisture). The mould 6 may thus be said to include said network of channels 15, which network is configured so that filling it causes the electrical connection elements electrically connecting the photovoltaic cells 5 of the photovoltaic substrate 2 to be encapsulated. It is clear that in this case when the photovoltaic substrate 2 is added to the mould 6, the electrical connection elements are placed in the channels of the network of channels 15.

According to one implementation, the process includes a step of removing said mould 6 comprising disengaging the second optical-lens stage 3 formed on, and especially fastened to, the photovoltaic substrate 2 relative to the first optical-lens stage 4 formed on, and especially fastened to, the transparent wall 11. The step of removing said mould 6 is followed by the step of assembling the first optical-lens stage 4 and the second optical-lens stage 3 so as to form the optical structure 1. It is clear that the removing step is carried out after the material 100, which is especially injected or poured, has been set, preferably when each of the second cavities 8 and each of the first cavities 10, and if relevant the channels or networks of channels described above, is filled therewith.

It will be understood from the above that the assembling step will preferably require a substantial precision in order to optimise the position of the focal points of the optical lenses of the first optical-lens stage 4 relative to the second optical-lens stage 3, and therefore the concentration on the photovoltaic cells 5. In this respect, the manufacturing process may include a step of positioning of the photovoltaic substrate 2 relative to the transparent wall 11, carried out before curing of the material 100, which is especially injected or poured, (and especially before the mould has been filled with the material 100) in order to allow, after demoulding of said mould 6, the assembling step to be implemented with an alignment, corresponding to said positioning, of the second optical-lens stage 3 fixed to the photovoltaic substrate 2 relative to the first optical-lens stage 4 fixed to said transparent wall 11.

This positioning step may especially use all or some of the following elements: said aforementioned positioning elements, and the aforementioned spacers. Furthermore, this positioning step may use an external part serving as a template, such as a part forming a right angle that will be used again during assembly of the optical concentrator/photovoltaics after demoulding. This external part may include two flats connected together to form a set square making contact with a right angle of the substrate and a right angle of the transparent wall. Alternatively, the external part may include points interacting with the substrate 2 and the transparent wall 11, in order to allow an unambiguous position corresponding to the aforementioned assembly configuration to be achieved.

The architecture of the optical structure 1 described according to the present invention may especially permit low, medium or high concentration levels. A low level is considered to be one allowing the standard solar irradiance value of 0.1 W/cm$^2$ to be multiplied by between 2 and 100 times. A medium level is considered to be one allowing the standard solar irradiance value of 0.1 W/cm$^2$ to be multiplied by between 100 and 300 times. A high value is considered to be one allowing the standard solar irradiance value of 0.1 W/cm$^2$ to be multiplied by between 300 and 1000 times.

Advantageously, the optical aperture of each of the lenses is minimized (by "minimized", what is meant is that the optical aperture of each of the lenses may range from a few millimetres to a few centimetres) so as to minimize the amount of heat at the photovoltaic cells (the maximum amount of heat may then be 1 W in the context of primary lenses of 3 cm by 3 cm) due to the concentration, to be dissipated. This especially makes it possible to avoid having to mount heat sinks under the photovoltaic substrate, and therefore to decrease cost.

Generally, the manufacture of the mould 6 may involve precision machining of a part, for example of a block of aluminium and especially of 7075 aluminium. The machining will be carried out in order to form the pluralities of first and second cavities 10, 8 described above, the aforementioned optional channels 15, 16 and the aforementioned optional positioning elements.

The cavities 8, 10 and/or the channels 15, 16 may be machined using diamond machining techniques.

It is clear that the mould will be produced in such a way as to have smooth surfaces in order to promote the demoulding. By way of example, diamond machining of 7075 aluminium allows a roughness lower than 5 nm to be obtained before covering with a nonstick layer such as for example a layer made of nickel, made of boron nitride and nickel, made of nickel polytetrafluoroethylene (PTFE) or made of perfluorodecyltrichlorosilane (FDTS).

According to one variant, the mould may also be made on polymethyl methacrylate (PMMA); this variant has the advantage of decreasing the adhesion of the set material 100 when the latter is PDMS.

Applicably to all the above, the material 100 may be based on silicone. Especially, the material 100 is polydimethylsiloxane (PDMS). The material 100 may be obtained by mixing two components A and B of a silicone elastomer in a tank to which a vacuum is applied to remove the bubbles from the material 100 before filling of the mould in order to prevent them being present in the optical lenses. PDMS has the advantage of being stable at high temperatures (beyond 260° C.), of having a very good transmittance of light radiation and of having a good resistance to degradation caused by ultraviolet.

The mould 6 may especially be filled with material 100 (filling step), especially PDMS, placed under a hydrostatic pressure allowing casting to be achieved via a communicating vessel. Furthermore, the material 100 may be set at a temperature comprised between 25° C. and 60° C. (the two-component silicone elastomer is vulcanizable cold and/or at a low temperature of about 40° C. to 60° C.).

The photovoltaic substrate 2 and/or the transparent wall 11 will have preferably undergone a treatment promoting adhesion of the material 100, especially during its polymerization if the material is PDMS, before they are added to the mould 6. This treatment may especially be the same as that mentioned above with regard to the photovoltaic substrate 2, and alternatively it may be a question of deposition of a primer suitable for PDMS and the bonding surface (for example a product such as Wacker Primer G 790®). The Wacker Primer G 790® may be applied with a weight/area ratio of 50 g/m$^2$ and be followed by a phase of evaporation of one to two hours at an ambient temperature of 25° C. and a humidity of 40%.

According to one particular example, the material 100 is Wacker Elastosil RT 601®, used by way of a silicone by mixing the components A and B in a weight ratio of 9:1. Dow Corning Sylgard 184® may also be used in a weight ratio of the components A and B of 10:1.

The aforementioned products are more generally transparent silicone elastomers (PDMS) that are composed of two components and either cold-vulcanising (CVEs) or vulcanizable at a temperature comprised between 40° C. and 60° C. At the very least, the set material 100 must be transparent in the spectral range 300 nm-1800 nm and resistant to concentrated ultraviolet radiation.

Generally, whatever the material 100 used, it preferably has a low viscosity of 3.5 Pa·s at the moment of the filling of the mould 6 so as to allow suitable filling of the cavities of the mould 6.

According to one implementation of the manufacturing process, the mould 6 and especially the photovoltaic substrate 2 and the transparent wall 11 are cooled in the step of filling the mould 6 with the material 100 so as to delay its polymerization in order to ensure adequate filling of the mould 6 and in particular degassing of the mixture forming the material 100. This is especially necessary if the filling of all the cavities through the channels is less rapid than its polymerization (especially when it is a question of PDMS).

According to one improvement, the material 100 is set, after the mould 6 has been filled, at a temperature corresponding to a desired operating temperature of the photovoltaic substrate 2 equipped with the optical structure 1, with the aim of decreasing optical losses due to mismatch in the thermal expansion coefficients of the various materials of the lenses, of the photovoltaic substrate 2 and of the transparent wall 11.

Such an optical concentrator 1 makes it possible to produce low-cost concentrator photovoltaic modules, photovoltaic modules of suitable weight to be mounted on roofs without needing to reinforce the structure of said roofs, or even high-voltage photovoltaic modules.

Furthermore, the process described above allows optical concentrators 1 of small thickness, between 1 cm and a few centimetres, to be manufactured, so as to increase the role of the aperture of the optical lenses in the dissipation of temperature with a view to decreasing the increase in temperature of the photovoltaic cells 5 during operation under insolation (if the thickness is small, the transparent wall 11 will be able to contribute to the dissipation of heat).

Because of the use of an optical concentrator 1 such as described, each photovoltaic cell 5 may generate a low current (lower than 200 milliamps for a primary lens size of up to 3 cm per side) allowing electrical tracks of small cross section (smaller than 300 microns in diameter for the maximum current) to be used so as to decrease manufacturing costs.

It is possible to use a photovoltaic substrate with cells, especially low-cost cells, without an optical concentrator, and this substrate may also integrate cells 5 that interact with the optical structure 1 such that the direct portion (the solar disc) of the light interacts, after concentration, with photovoltaic cells equipped with an optical concentrator, and that scattered light interacts with cells without an optical concentrator. This makes it possible to maximize the production of electricity even in the case of failure of a tracker allowing the modules to be oriented in the direction of the sun. Moreover, the miniaturization of the size of the primary lenses makes it possible to ensure those photovoltaic cells of the substrate which are not equipped with an optical concentrator are not degraded in the case of misalignment of the concentrated light.

According to another method of implementation of the manufacturing process, the mould may alternatively be closed by two sheets forming part of the mould and therefore not being a photovoltaic substrate and a transparent wall. In such a method of implementation, the photovoltaic substrate is then placed in position relative to the optical structure which is set or obtained by moulding. For example, the optical structure is fixed on the substrate.

The invention also relates to a mould such as described above for manufacturing the photovoltaic concentrator, especially in the context of the described manufacturing process.

The use of a photovoltaic substrate equipped with such an optical structure allows the number of photovoltaic cells to be increased in order to increase the output voltage generated by the photovoltaic concentrator.

The invention claimed is:

1. A process for manufacturing a photovoltaic concentrator comprising a photovoltaic substrate equipped with a plurality of photovoltaic cells, and an optical structure comprising a first optical-lens stage and a second optical-lens stage that are intended to optically interact with each other, wherein the process includes:
   providing a mold, wherein the mold includes a first face equipped with a plurality of first cavities each delimiting a shape complementary to that of a corresponding optical lens of the first optical-lens stage and a second face equipped with a plurality of second cavities each delimiting a shape complementary to that of a corresponding optical lens of the second optical-lens stage;
   adding a photovoltaic substrate equipped with a plurality of photovoltaic cells to the second face of the mold so that each photovoltaic cell of the plurality of photovoltaic cells is placed in a corresponding second cavity;
   adding a transparent wall to the first face of the mold; and
   simultaneously forming the first optical-lens stage and the second optical-lens stage using the provided mold, and filling the mold with a material.

2. The process according to claim 1, wherein the filling of the mold includes guiding the material so that the material fills each first cavity of the plurality of first cavities and each second cavity of the plurality of second cavities.

3. The process according to claim 1,
   wherein the filling of the mold includes guiding the material so that the material fills each first cavity of the plurality of first cavities and each second cavity of the plurality of second cavities,
   wherein the guiding of the material includes using a network of flow channels formed in the second face of the mold to channel a flow of said material in order to fill each of the plurality of second cavities.

4. The process according to claim 3, wherein, the photovoltaic cells being electrically connected to one another by electrical connection elements formed on the surface of the photovoltaic substrate bearing the photovoltaic cells, the guiding of the material allows the network of channels to be filled with the material and, as a result, the electrical connection elements to be encapsulated by the material after curing of the material.

5. The process according to claim 1, wherein the process includes removing the mold, comprising disengaging the formed first optical-lens stage relative to the formed second optical-lens stage, the removing of the mold being followed by assembling the first optical-lens stage and the second optical-lens stage.

6. The process according to claim 1,
   wherein the process includes removing the mold, comprising disengaging the formed first optical-lens stage relative to the formed second optical-lens stage, the removing of the mold being followed by assembling the first optical-lens stage and the second optical-lens stage,
   and wherein the process includes positioning the photovoltaic substrate relative to the transparent wall, the positioning being carried out before curing of the material, in order to allow, after demolding of the mold, the assembling to be implemented with an alignment, corresponding to the positioning, of the second optical-lens stage fixed to the photovoltaic substrate relative to the first optical-lens stage fixed to the transparent wall.

7. The process according to claim 1, wherein the material used in the filling of the mold is a transparent polymer that is able to be shaped by casting or injection molding.

8. The process according to claim 7, wherein (i) the filling of the mold being carried out by pouring the material into the mold, the material is a PDMS (polydimethylsiloxane), or (ii) the filling of the mold being carried out by injecting the material into the mold, the material is a PC (polycarbonate) or PMMA (polymethyl methacrylate).

9. The process according to claim 7, wherein the material used in the filling of the mold is a polymer that is curable after casting or injection molding.

10. The process according to claim 1, comprising filling the mold by injecting or pouring the material.

11. The process according to claim 1, wherein the filling of the mold includes guiding the material so that the material fills each of the first cavities and each of the second cavities.

12. The process according to claim 1, wherein the process includes removing the mold, comprising disengaging the formed first optical-lens stage relative to the formed second optical-lens stage, the removing of the mold being followed by assembling the first optical-lens stage and the second optical-lens stage.

* * * * *